(12) United States Patent
Stephan et al.

(10) Patent No.: US 12,266,874 B2
(45) Date of Patent: Apr. 1, 2025

(54) THERMAL CONNECTION BETWEEN PRINTED CIRCUIT BOARD AND BASE PLATE WITH EPOXY MOLDED MATERIAL

(71) Applicant: Vitesco Technologies USA, LLC, Auburn Hills, MI (US)

(72) Inventors: Uwe Stephan, Schaumburg, IL (US); Donald J. Zito, Fox River Grove, IL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 422 days.

(21) Appl. No.: 17/661,645

(22) Filed: May 2, 2022

(65) Prior Publication Data

US 2023/0352861 A1 Nov. 2, 2023

(51) Int. Cl.
| | |
|---|---|
| *H01R 12/57* | (2011.01) |
| *H01R 13/502* | (2006.01) |
| *H05K 3/28* | (2006.01) |
| *H05K 3/30* | (2006.01) |
| *H05K 3/46* | (2006.01) |

(52) U.S. Cl.
CPC ........... *H01R 12/57* (2013.01); *H01R 13/502* (2013.01); *H05K 3/284* (2013.01); *H05K 3/303* (2013.01); *H05K 3/4626* (2013.01)

(58) Field of Classification Search
CPC ...... H01R 12/57; H01R 13/502; H05K 3/284; H05K 3/303; H05K 3/4626; H05K 7/20854; H05K 7/20472; H05K 5/0217; H05K 1/0201; H05K 5/0034; H05K 5/06; H05K 7/2039

USPC .......................................................... 439/78
See application file for complete search history.

(56) References Cited

U.S. PATENT DOCUMENTS

| | | | | |
|---|---|---|---|---|
| 6,307,749 B1* | 10/2001 | Daanen | .............. | H05K 7/20854 361/728 |
| 2005/0099778 A1* | 5/2005 | Nakanishi | .......... | H05K 7/20854 439/76.2 |
| 2006/0018098 A1* | 1/2006 | Hill | ......... | H05K 3/284 361/708 |
| 2006/0044771 A1* | 3/2006 | Yeo | .................... | H01L 23/49531 257/E23.092 |
| 2009/0057006 A1* | 3/2009 | Kishibata | ............... | H05K 3/284 29/841 |
| 2019/0080931 A1* | 3/2019 | Ito | ......... | H01L 21/565 |
| 2020/0008292 A1* | 1/2020 | Sato | ......... | H03F 3/187 |

\* cited by examiner

*Primary Examiner* — Abdullah A Riyami
*Assistant Examiner* — Amara Anderson (57) ABSTRACT

A control unit having a connection structure for connecting components of the control unit to a base plate which is cost effective, and facilitates heat transfer from a printed circuit board (PCB) to the base plate. The control unit includes circuitry mounted to a PCB, and the PCB is mounted to a base plate. The circuitry is over molded with epoxy material during manufacturing. The epoxy material flows between the PCB and the base plate, such that a layer of the epoxy is disposed between the PCB and the base plate. This layer of epoxy functions as a heat transfer layer, and a connection structure to connect the PCB to the base plate. The epoxy material transfers heat from the surface of the PCB in contact with the layer of epoxy to the surface of the base plate in contact with the layer of epoxy.

17 Claims, 8 Drawing Sheets

THERMAL CONNECTION BETWEEN PRINTED CIRCUIT BOARD AND BASE PLATE WITH EPOXY MOLDED MATERIAL

FIELD OF THE INVENTION

The invention relates generally to a control unit having a connection structure for connecting components of the control unit to a base plate using an overmolding process where the connection structure facilitates heat transfer from the PCB to the base plate.

BACKGROUND OF THE INVENTION

Many applications use a control unit for controlling various components. Control units are used in various technology areas, such as automotive, medical, or computing devices. One type of control unit, such as a transmission control unit (TCU) is used to operate a transmission. TCUs typically include a printed circuit board (PCB) having various circuitry, and the PCB is mounted to a base plate. The PCB and base plate are then assembled into the cavity of a housing having various connectors which are in electrical communication with the PCB. The PCB is typically mounted to the baseplate using fasters or some type of adhesive, such as a thermally conductive adhesive (TCA).

These known control units also require the ability to transfer heat from the PCB to the base plate, where the base plate functions as a heat sink. Existing designs include the use of pressure sensitive adhesive (PSA) or TCA to connected the PCB and the heat sink together, as well as transfer heat from the PCB to the heatsink. In addition to PSA or TCA, some control units also include fasteners, such as screws, to connect the PCB and heat sink together. Producing a control unit in this manner requires additional material and dispensing equipment to provide this thermal interface for heat transfer between the PCB and the heat sink.

Accordingly, there exists a need for a control unit which eliminates the need for a separate component, such as PSA or TCA, or fasteners, to attach a PCB to a heat sink, which also has desirable heat transfer properties.

SUMMARY OF THE INVENTION

In an embodiment, the present invention is a control unit having a connection structure for connecting components of the control unit to a base plate which is cost effective, and the connection structure facilitates heat transfer from a printed circuit board (PCB) to the base plate, and also provides electrical insulation between the PCB and the base plate.

In an embodiment, the control unit includes circuitry mounted to a PCB, and the PCB is mounted to a base plate. The electronic circuits are over molded with epoxy material during manufacturing. The epoxy material flows between the PCB and the base plate, such that a layer of the epoxy is disposed between the PCB and the base plate. This layer of epoxy functions as a heat transfer layer and as an electrical insulation layer, and a connection structure to connect the PCB to the base plate. The epoxy material transfers heat from the PCB to the baseplate (i.e., heat is transferred from the surface of the PCB in contact with the layer of epoxy to the surface of the base plate in contact with the layer of epoxy), and electrically insulates the PCB from the base plate.

In an embodiment, during assembly the PCB is placed in contact with one or more standoffs formed as part of the base plate to form a pre-assembly, such that there is a gap between the PCB and the base plate. In an embodiment, the gap is 0.8 mm, but it is within the scope of the invention that the gap may be more or less. In an embodiment, the PCB and the base plate are aligned when placed in a tooling device by several half-punches, or alignment standoffs, formed as part of the base plate, or retractable pins in the tooling device. The tooling device clamps and holds the pre-assembly in place during the over molding process. The pre-assembly of the PCB and base plate is then over molded with an epoxy material to secure the PCB and the base plate together. A portion of this epoxy material flows into the gap between the PCB and the base plate. Another portion of the epoxy material flows around portions of the PCB and the base plate to form an encapsulation housing around the PCB and the base plate.

In an embodiment, the control unit is over molded with the epoxy material. The epoxy material covers and protect the electronics mounted to the PCB, and improves robustness, and improves packaging. Additionally, the epoxy provides heat transfer between the PCB and the base plate. Therefore, no additional material is required, eliminating the need for fasteners or adhesive materials, and also no additional manufacturing steps or equipment are required.

In an embodiment, the PCB being mounted to the base plate using the over molding process results in no additional cost.

In an embodiment, the present invention is a control unit, including a base plate, a printed circuit board (PCB) connected to the base plate, an encapsulation housing, and a heat transfer layer formed as part of the encapsulation housing. The heat transfer layer is disposed between the PCB and the base plate, such that the heat transfer layer transfers heat from the PCB to the base plate. In an embodiment, the base plate and the PCB are connected together by the encapsulation housing.

In an embodiment, the encapsulation housing includes a first layer disposed on a side of the PCB, and a second layer disposed on a side of the base plate. The heat transfer layer is disposed on the opposite side of the PCB relative to the first layer, and the heat transfer layer is disposed on the opposite side of the base plate relative to the second layer.

In an embodiment, at least one flow aperture is integrally formed as part of the base plate, and at least a portion of the encapsulation housing is disposed in the at least one flow aperture and is integrally formed with the heat transfer layer and the second layer, and is located between the heat transfer layer and the second layer.

In an embodiment, the heat transfer layer is a third layer of the encapsulation housing which is disposed between the PCB and the base plate. The third layer electrically insulates the base plate from the PCB.

In an embodiment, at least one standoff is integrally formed as part of the base plate, the standoff is in contact with the PCB, and the standoff extends through the heat transfer layer. In an embodiment, there is a distance between the PCB and the base plate which corresponds to the length of the standoff.

In an embodiment, a first plurality of assembly apertures is integrally formed as part of the PCB, and a second plurality of assembly apertures is integrally formed as part of the base plate. Each of the first plurality of assembly apertures is aligned with a corresponding one of the second plurality of assembly apertures, and a portion of the encapsulation housing extends through each of the first plurality of assembly apertures and the second plurality of assembly apertures.

In an embodiment, at least one stanchion is integrally formed as part of the encapsulation housing such that the stanchion is integrally formed with the heat transfer layer. The stanchion extends through at least one of the first plurality of assembly apertures and at least one of the second plurality of assembly apertures.

In an embodiment, circuitry is mounted to the PCB, at least a portion of the circuitry is covered by the encapsulation housing, and heat generated by the circuitry is transferred through the heat transfer layer to the base plate.

In an embodiment, a cover is integrally formed as part of the base plate, and a cavity is integrally formed as part of the cover. A portion of the heat transfer layer is adjacent the cover, and the cover is adjacent an area of the PCB unoccupied by the encapsulation housing.

In an embodiment, a circumferential lip is integrally formed as part of the base plate such that the circumferential lip circumscribes the cover, and a portion of the heat transfer layer is adjacent the circumferential lip.

In an embodiment, at least one groove is integrally formed as part of the encapsulation housing such that a portion of the groove is formed by the heat transfer layer, and another portion of the groove is formed by the second layer. A portion of the base plate is disposed in the groove, connecting the base plate and the encapsulation housing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
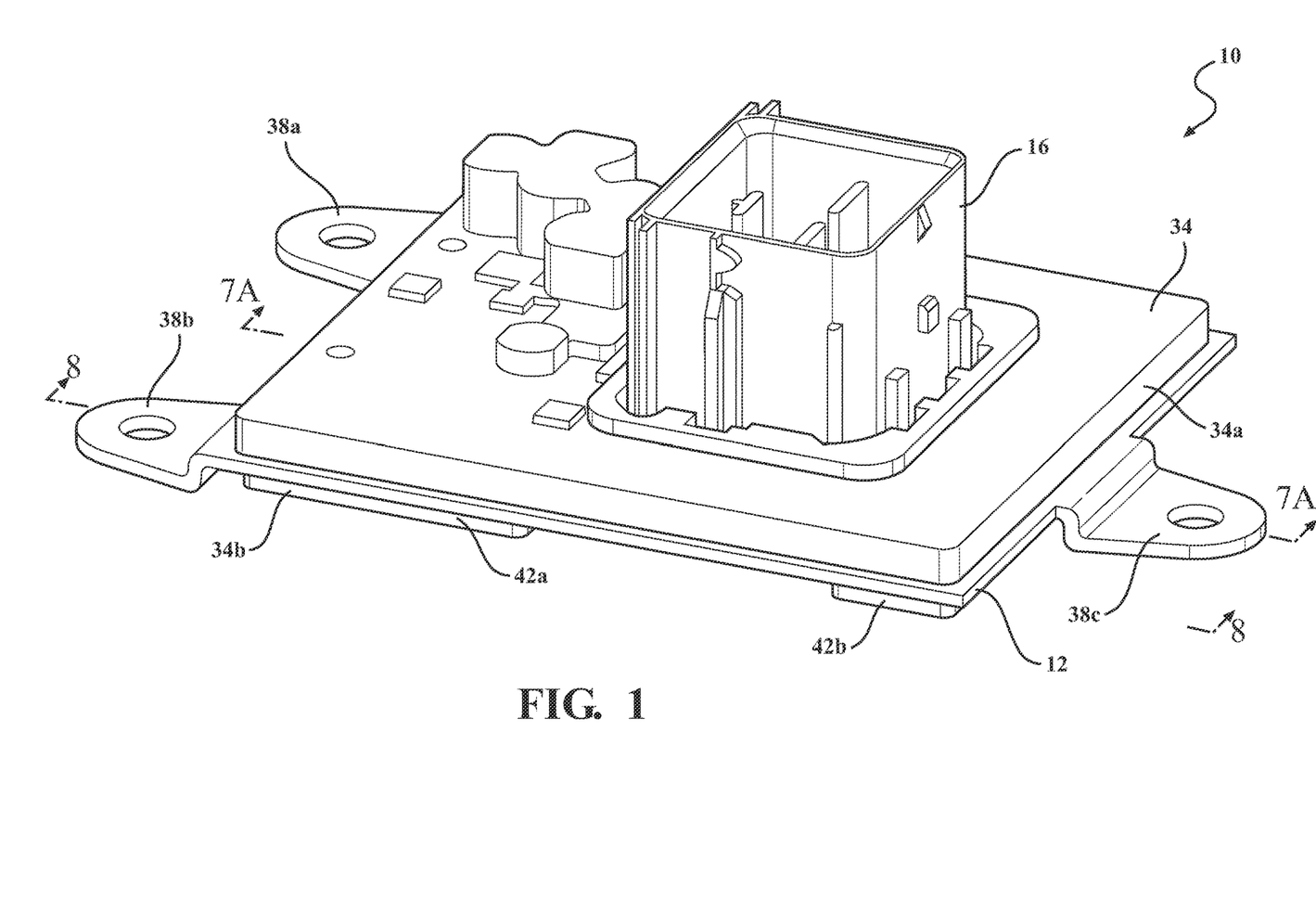
FIG. 1 is a first perspective view of a control unit, according to embodiments of the present invention.
Figure 2:
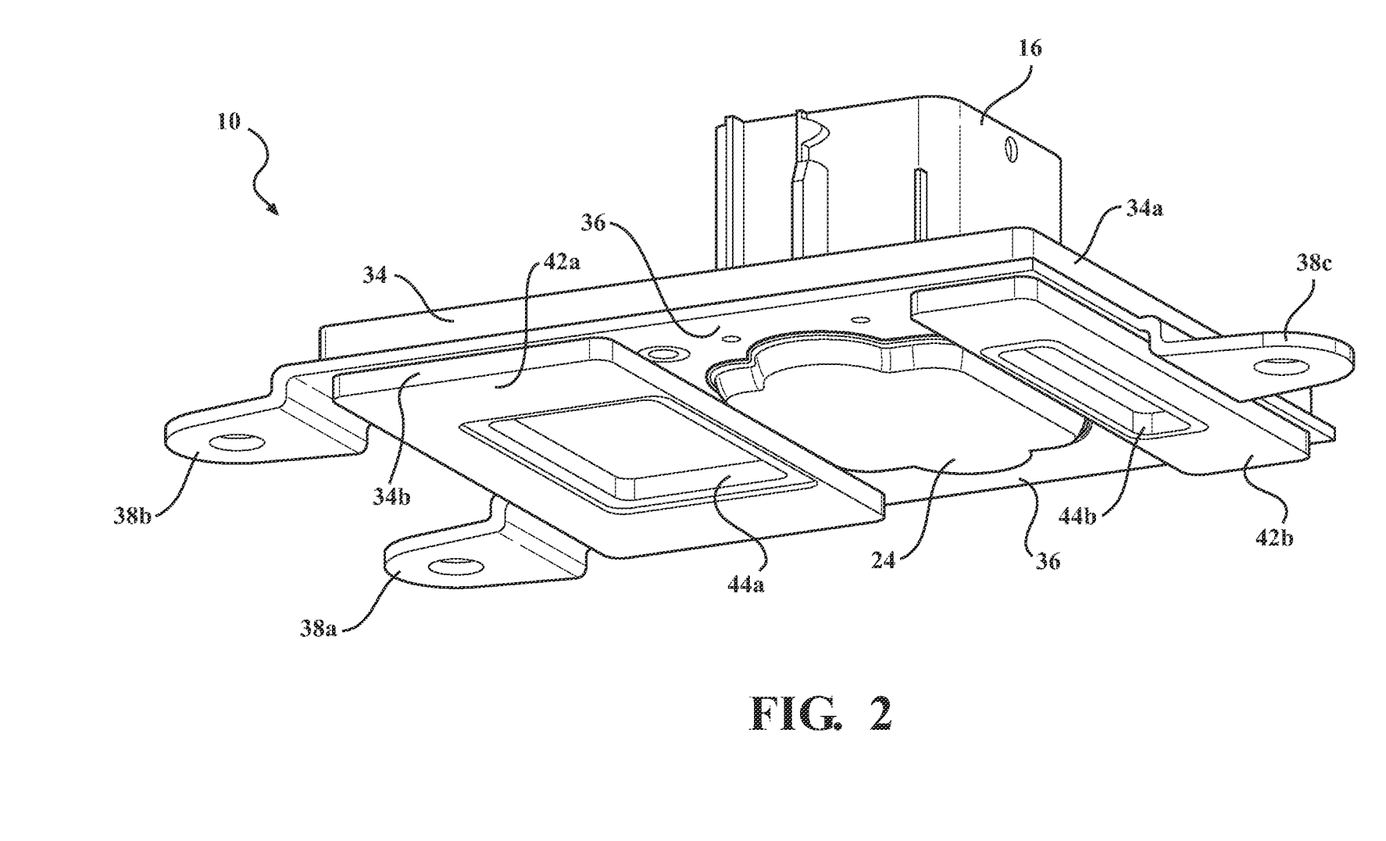
FIG. 2 is a second perspective view of a control unit, according to embodiments of the present invention.

An embodiment of a control unit having a connection structure according to the present invention is shown in FIGS. 1-2, generally at 10. Referring to FIGS. 1-3, 7A, and 8, the control unit 10 includes a base plate 12 having a first side 12a and a second side 12b, a printed circuit board (PCB) 14 having a first side 14a and a second side 14b, and a connector shroud 16.

Connected to the first side 14a of the PCB 14 is various circuitry, shown generally at 18. There is also a plurality of pins, shown generally at 20, which are connected to the first side 14a of the PCB 14 and are part of the circuitry 18. The pins 20 extend through the PCB 14 such that part of each of the pins 20 extends into a cavity, shown generally 22, of a cover 24, where the cover 24 is integrally formed as part of the base plate 12.

Figure 3:
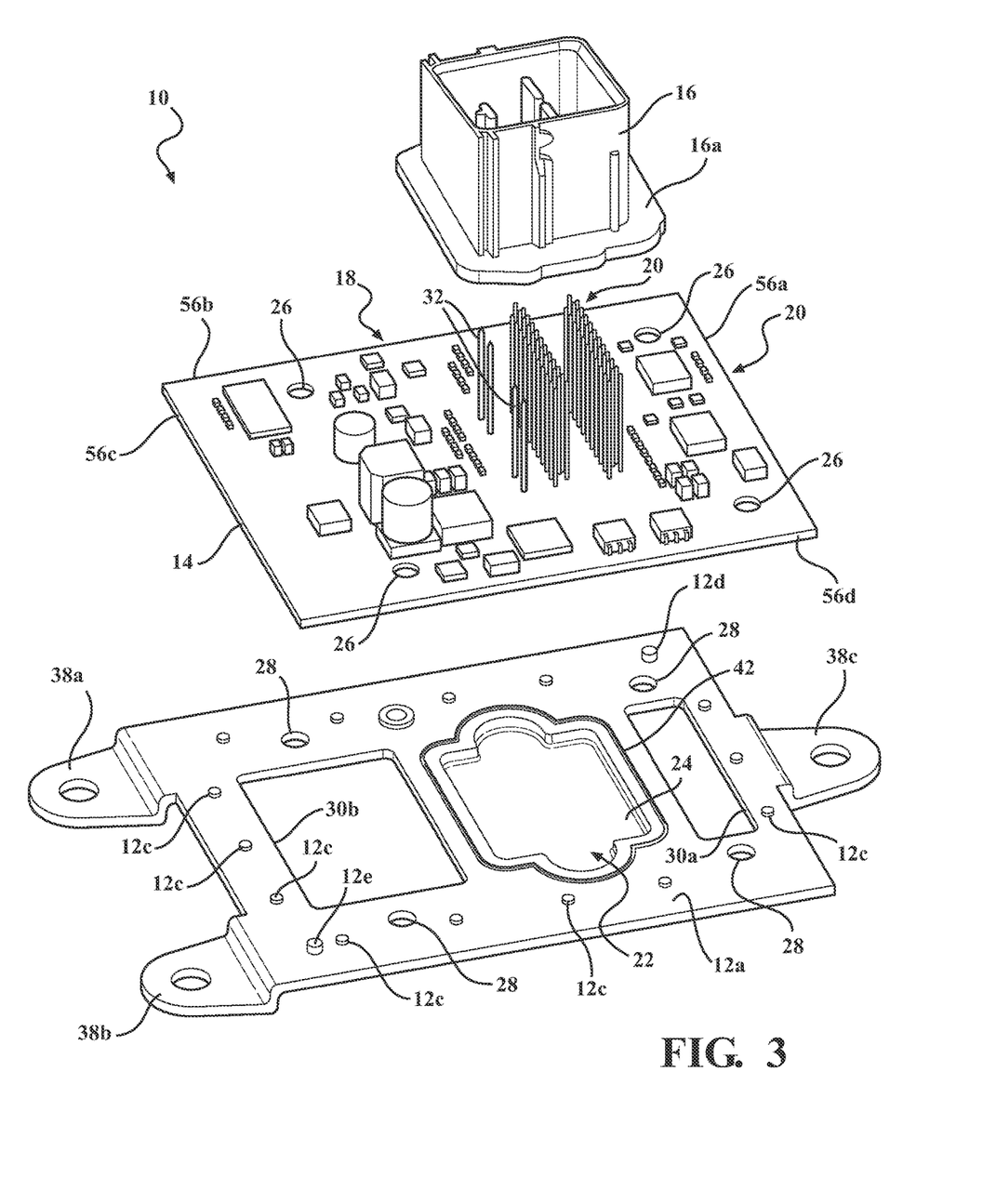
FIG. 3 is an exploded view of several components which are part of a control unit, according to embodiments of the present invention.
Figure 4:
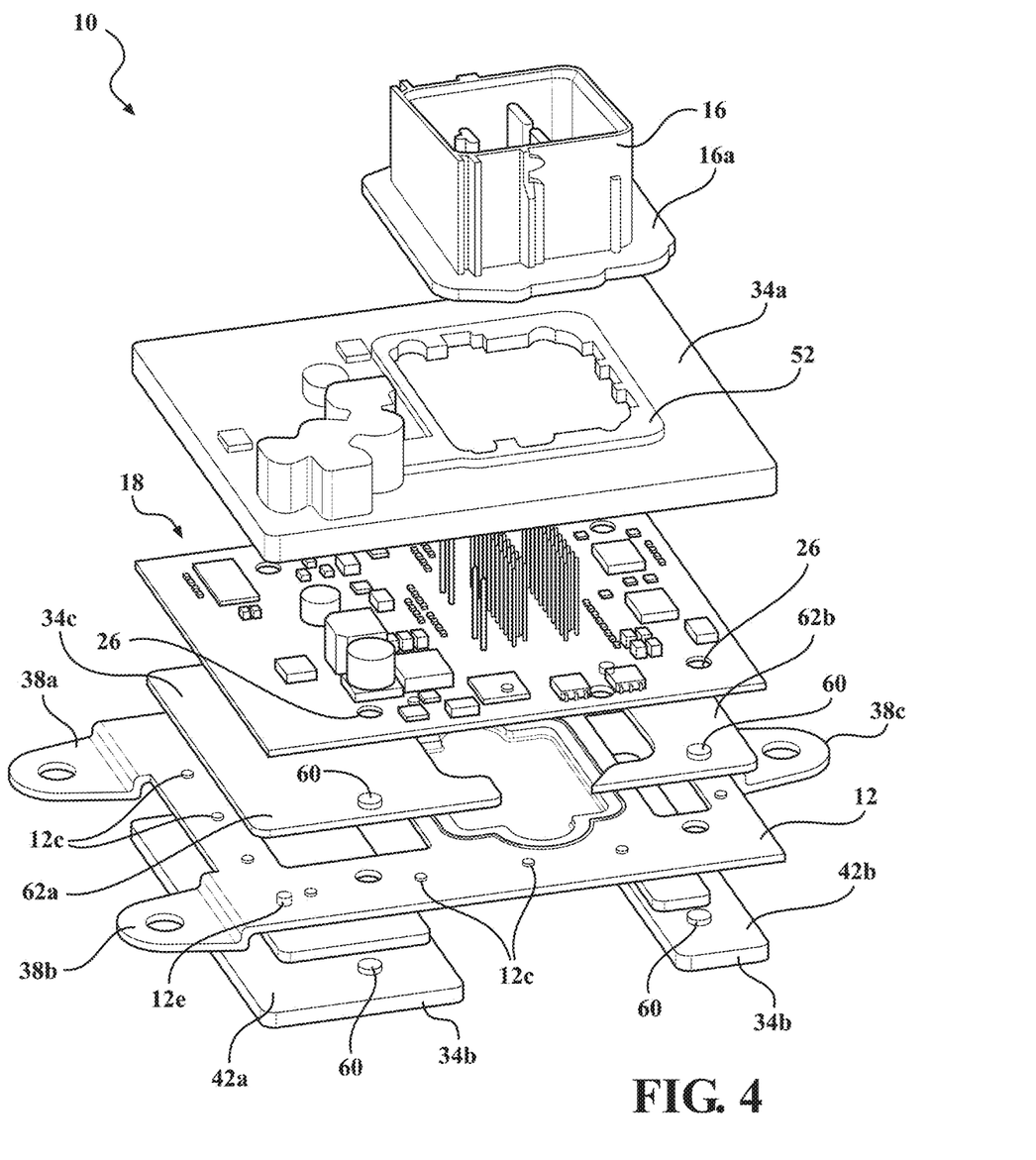
FIG. 4 is an exploded view of a control unit, according to embodiments of the present invention.

Integrally formed as part of the PCB 14 is a first plurality of assembly apertures 26, and integrally formed as part of the base plate 12 is a second plurality of assembly apertures 28. In this embodiment, there are a total of four assembly apertures 26 formed as part of the PCB 14, and four assembly apertures 28 formed as part of the base plate 12, but it is within the scope of the invention that more of less assembly apertures may be formed as part of the PCB 14 and the base plate 12, respectively. Also integrally formed as part of the base plate 12 are two flow apertures 30a, 30b. A plurality of standoffs 12c, best seen in FIGS. 3-4 and 7A-7B, is formed as part of the first side 12a of the base plate 12. Referring to FIGS. 3-4, there is also a first alignment standoff 12d and a second alignment standoff 12e which are formed as part of the first side 12a of the base plate 12. The alignment standoffs 12d, 12e are greater in height than the standoffs 12c, such that the alignment standoffs 12d, 12e protrude a greater distance away from the PCB 14 compared to the standoffs 12c.

In the present embodiment, the base plate 12 is made from aluminum, but it is within the scope of the invention that other materials may be used. The base plate 12 is formed using a stamping process, and during the stamping process, the base plate 12 is stamped from a metal blank, such that the standoffs 12c and the alignment standoffs 12d, 12e are formed, as well as the cover 24, and several connecting flanges 38a, 38b, 38c. As a result of the stamping process, there is a circumferential groove 40 which is pressed into the second side 12b of the base plate 12, which results in the formation of a corresponding circumferential lip 42 on the first side 12a of the base plate 12.

Referring to FIG. 3, generally, during assembly, the connector shroud 16 is placed in contact with the first side 14a of the PCB 14, and the connector shroud 16 is properly aligned by alignment pins 32 which extend into the connector shroud 16 as the connector shroud 16 is placed in contact with the PCB 14. The connector shroud 16 also includes a circumferential flange 16a which is placed in contact with the first side 14a of the PCB 14 during assembly. The PCB 14 is then positioned such that each alignment standoff 12d, 12e extends into a corresponding aperture (not shown) formed as part of the PCB 14, and the second side 14b of the PCB 14 is in contact with the standoffs 12c and the circumferential lip 42 of the base plate 12 such that each of the first plurality of assembly apertures 26 is aligned with a corresponding one of the second plurality of assembly apertures 28. The alignment standoffs 12d, 12e extending into corresponding apertures of the PCB 14 provide proper positioning of the base plate 12 and PCB 14 relative to one another during manufacturing. In the embodiment shown, the standoffs 12c have a thickness of 0.8 mm, such that there is a distance, or a gap 58 (shown in FIG. 7B), between the PCB 14 and the base plate 12 when the base plate 12 is positioned as described above. However, it is within the scope of the invention that the standoffs 12c and circumferential lip 42 may have different dimensions, to change the distance or gap 58 between the PCB 14 and the base plate 12.

The desired positioning of the connector shroud 16, the PCB 14, and the base plate 12 forms a pre-assembly. The pre-assembly includes the connector shroud 16 being placed in contact with the first side 14a of the PCB 14, and the second side 14b of the PCB 14 being placed in contact with the standoffs 12c and the circumferential lip 42 as described above. The pre-assembly is placed into a tooling device, or a molding device, where several holding devices, such as clamps or the like, hold the pre-assembly in place while an epoxy material is injected into the tooling device during an over molding process. Referring to FIGS. 1-2, the epoxy material is injected into the tooling device to form an encapsulation housing 34, which surrounds various parts of the base plate 12, the PCB 14, and the connector shroud 16 to function as a connection structure. Referring to FIGS. 4 and 6-8, the encapsulation housing 34 includes a first layer 34a on the first side 14a of the PCB 14, a second layer 34b on the second side 12b of the base plate 12, and a third layer 34c disposed between the PCB 14 and the base plate 12, such that at least part of the second side 14b of the PCB 14 is in contact with the third layer 34c, and at least part of the first side 12a of the base plate 12 is in contact with the third layer 34c. The third layer 34c is a heat transfer layer, which transfers heat away from the PCB 14 to the base plate 12. The third layer 34c also acts as an electrical insulation layer, and electrically insulates the base plate 12 from the PCB 14.

Figure 5:
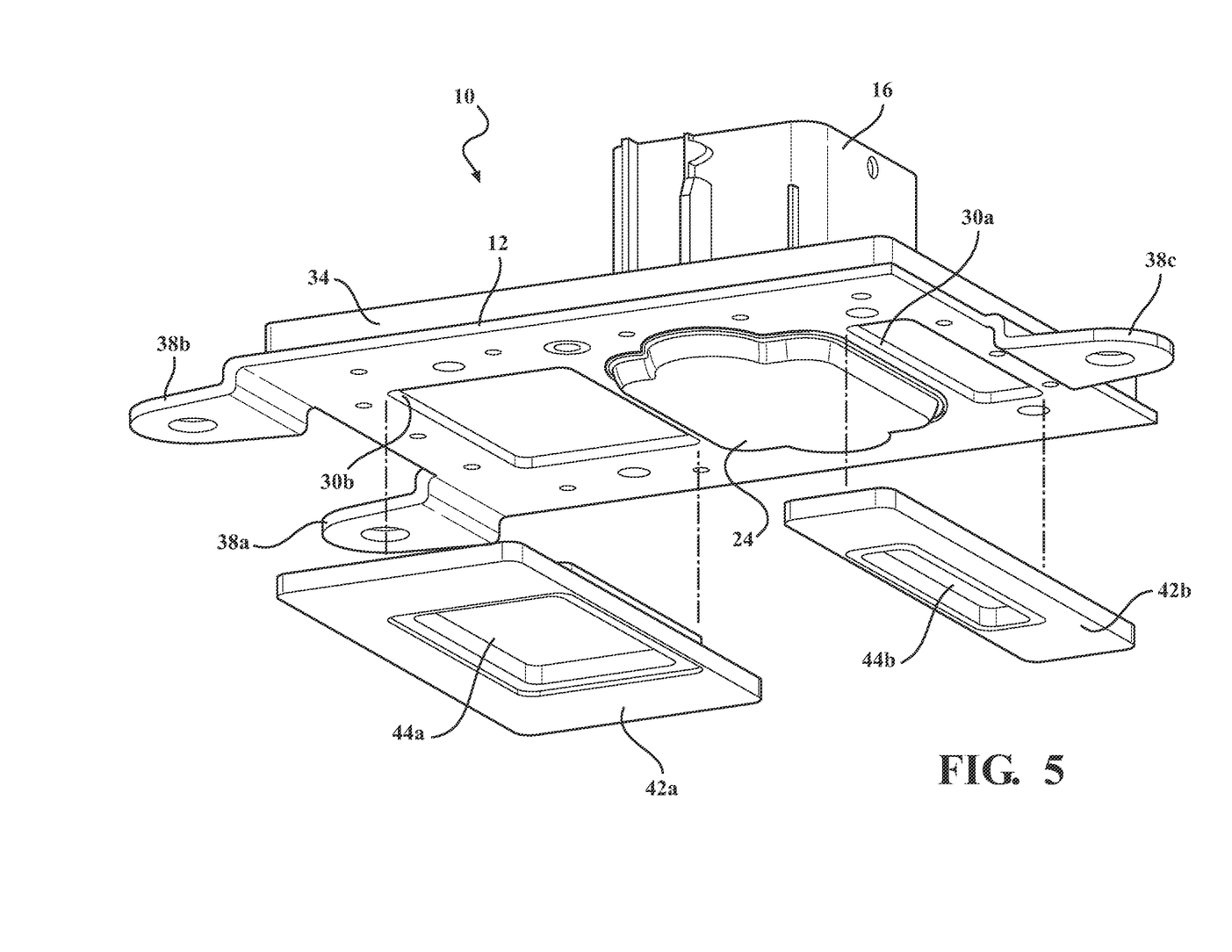
FIG. 5 is a partially exploded view of a control unit, according to embodiments of the present invention.
Figure 6:
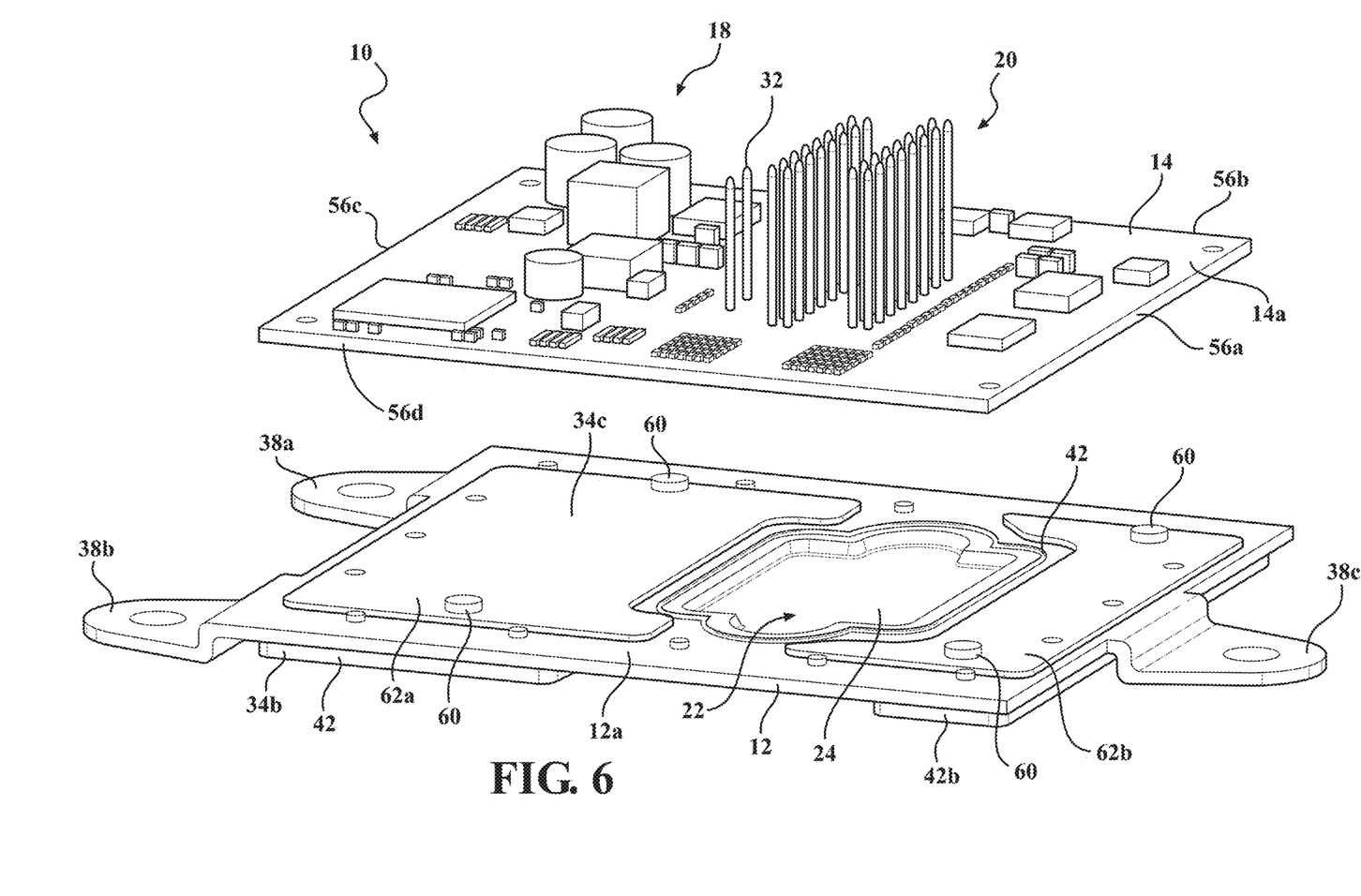
FIG. 6 is a second partially exploded view of a control unit, according to embodiments of the present invention.

During the over molding process, the epoxy material is injected into the tooling device such that at least a portion of the material flows through the first plurality of assembly apertures 26 and the second plurality of assembly apertures 28, and portions of the epoxy material also flow through the flow apertures 30a, 30b. The shape of the layers 34a, 34b, 34c, and therefore, the overall shape of the encapsulation housing 34 is determined by the shape of the tooling device. While the shape of the encapsulation housing 34 and the layers 34a, 34b, 34c is as shown in the Figures, it is within the scope of the invention that the tooling device may be shaped and configured in any desired manner such that the shape of the encapsulation housing 34 and the layers 34a, 34b, 34c may be changed to suit any application. Referring to FIGS. 4-6, there are several exploded views of the control unit 10 which depict the parts of each layer 34a, 34b, 34c, however, the layers 34a, 34b, 34c of the encapsulation housing 34 are a single component and are formed during the over molding process, and cannot be separated without catastrophically damaging the control unit 10.

Referring again to FIGS. 1-2, 4-5, and 7A-8, in the embodiment shown, once the over molding process is complete, the first layer 34a encapsulates most of the first side 14a of the PCB 14 and also the circuitry 18, with the exception of the area of the first side 14a of the PCB 14 which the connector shroud 16 is attached to. Also, once the over molding process is complete, several stanchions 60 are integrally formed as part of the encapsulation housing 34. More specifically, the stanchions 60 are integrally formed with the first layer 34a, the second layer 34b, and the third layer 34c. Each of the stanchions 60 extend through one of the first plurality of assembly apertures 26 and one of the second plurality of assembly apertures 28. Part of the encapsulation housing 34 which forms the third layer 34c is also disposed between and in contact with portions of the base plate 12 and the PCB 14, with the exception of the areas of the PCB 14 which are in contact with the standoffs 12c, the alignment standoffs 12d, 12e, and the circumferential lip 42, and the area 54 of the PCB 14 which the circumferential lip 42 prevents the epoxy from contacting during the over molding process. This area 54 is adjacent the cavity 22 of the cover 24. Also, once the over molding process is complete, the second layer 34b does not contact the entire second side 12b of the base plate 12. The second layer 34b contacts the second side 12b in the areas of the base plate 12 which are unoccupied by the cover 24, and the second layer 34b does not contact areas 36 of the base plate 12 which are adjacent the cover 24, best seen in FIGS. 5 and 7A-9. The encapsulation housing 34 also surrounds each peripheral wall 56a, 56b, 56c, 56d of the PCB 14. Once the over molding process is completed, the PCB 14 is protected from, and prevented from coming in contact with, fluids or gases.

Referring to FIGS. 1-2 and 4-5, the second layer 34b has two parts which are located on the second side 12b of the base plate 12. There is a first part 42a which is adjacent the cover 24, and a second part 42b which adjacent the cover 24 on the opposite side of the cover 24 as the first part 42a. The first part 42a has a recess 44a and the second part 42b has a second recess 44b, such that amount of epoxy used to create the second layer 34b is minimized reducing the overall weight of the control unit 10, while still maintaining the proper structural integrity. The inclusion of the recesses 44a, 44b also results in a reduction in thickness of the parts 42a, 42b, which facilitates an even curing of the epoxy during the overmolding process.

In the embodiment shown, the third layer 34c has two sections, a first section 62a and a second section 62b. The first section 62a is located on one side of the circumferential lip 42, and the second section 62b is located on the opposite side of the circumferential lip 42 as the first section 62a.

Figure 7A:
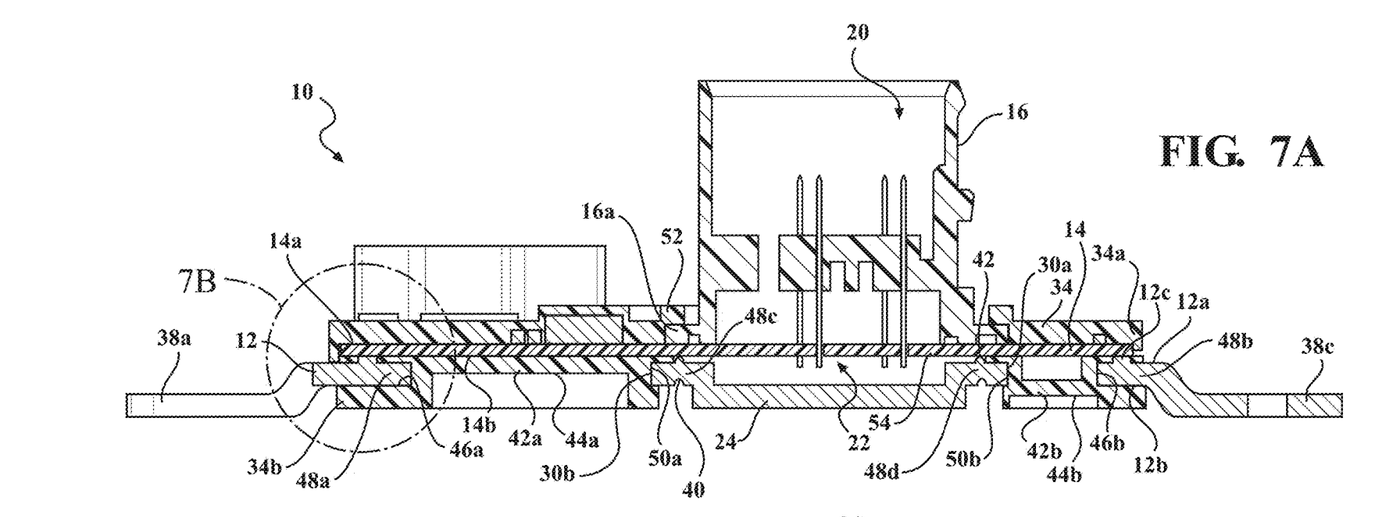
FIG. 7A is a sectional view taken along lines 7A-7A of FIG. 1.
Figure 7B:
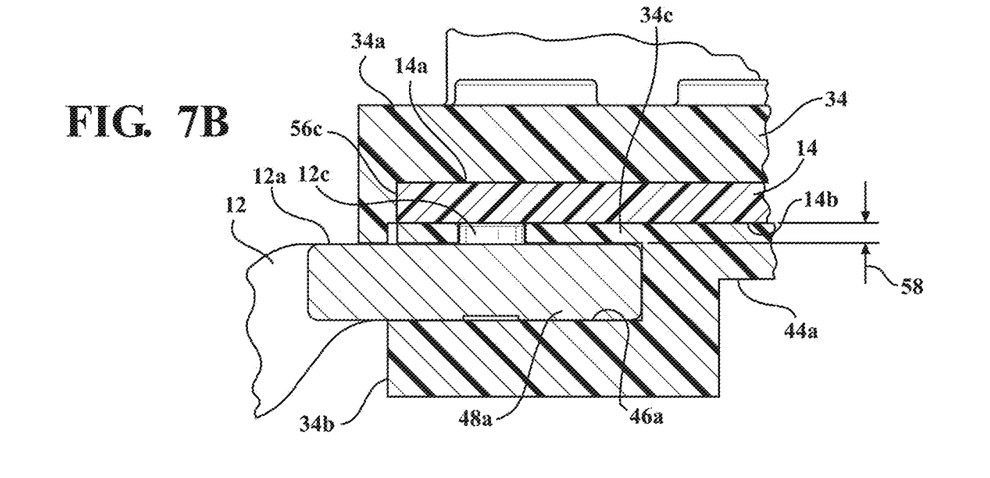
FIG. 7B is an enlarged view of the circled portion of FIG. 7A.
Figure 8:
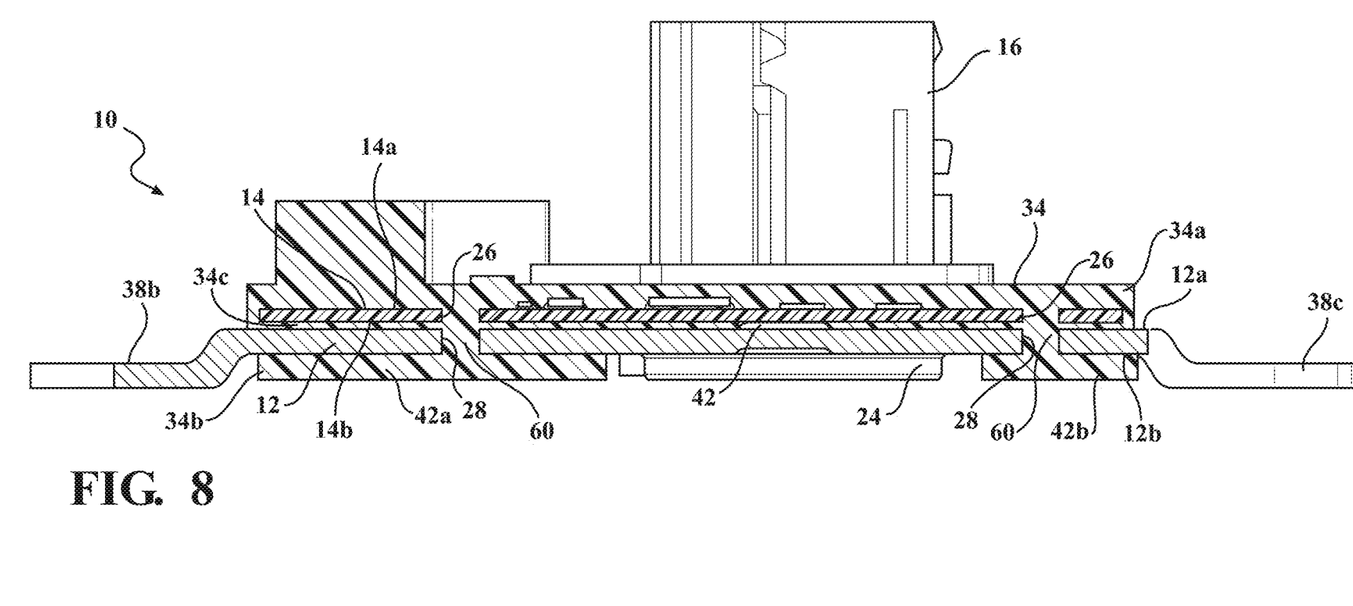
FIG. 8 is a second sectional view taken along lines 8A-8A of FIG. 1.

Once the over molding process is complete, there are several grooves formed as part of the encapsulation housing 34, and portions of the base plate 12 are located in the grooves. Referring to FIG. 7A, there is a first groove 46a which a first portion 48a of the base plate 12 extends into, and a second groove 46b which a second portion 48b of the base plate 12 extends into. Additionally, there is also a first shallow groove 50a in which a third portion 48c extends into, and a second shallow groove 50b in which a fourth portion 48d extends into. Both of the shallow grooves 50a, 50b are adjacent different parts of the circumferential groove 40.

Once the overmold process is complete, the circumferential flange 16a is located between a portion 52 of the encapsulation housing 34 and the PCB 14, securing the connector shroud 16 to the PCB 14.

The control unit 10 described may be suitable for any type of application where a control unit is required, such as, but not limited to, an engine control unit, a transmission control unit, or the like.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a control unit, including:
     a base plate;
     a printed circuit board (PCB) connected to the base plate;
     an encapsulation housing, the encapsulation housing further comprising:
       a first layer disposed on a side of the PCB; and
       a second layer disposed on a side of the base plate;
     at least one flow aperture integrally formed as part of the base plate;
     a heat transfer layer formed as part of the encapsulation housing, the heat transfer layer disposed between the PCB and the base plate, such that the heat transfer layer transfers heat from the PCB to the base plate, and at least a portion of the encapsulation housing is disposed in the at least one flow aperture and is integrally formed with the heat transfer layer and the second layer, and is located between the heat transfer layer and the second layer;

wherein the base plate and the PCB are connected together by the encapsulation housing, and the heat transfer layer is disposed on the opposite side of the PCB relative to the first layer, and the heat transfer layer is disposed on the opposite side of the base plate relative to the second layer.

2. The apparatus of claim 1, the heat transfer layer further comprising a third layer of the encapsulation housing disposed between the PCB and the base plate, wherein the third layer electrically insulates the base plate from the PCB.

3. The apparatus of claim 1, further comprising:
at least one standoff integrally formed as part of the base plate;
wherein the at least one standoff is in contact with the PCB, and the at least one standoff extends through the heat transfer layer.

4. The apparatus of claim 3, further comprising a distance between the PCB and the base plate which corresponds to the length of the at least one standoff.

5. The apparatus of claim 1, further comprising:
a first plurality of assembly apertures integrally formed as part of the PCB; and
a second plurality of assembly apertures integrally formed as part of the base plate;
wherein each of the first plurality of assembly apertures is aligned with a corresponding one of the second plurality of assembly apertures, and a portion of the encapsulation housing extends through each of the first plurality of assembly apertures and the second plurality of assembly apertures.

6. The apparatus of claim 5, further comprising:
at least one stanchion integrally formed as part of the encapsulation housing such that the at least one stanchion is integrally formed with the heat transfer layer;
wherein the at least one stanchion extends through a corresponding one of the first plurality of assembly apertures and at least one of the second plurality of assembly apertures.

7. The apparatus of claim 1, further comprising circuitry mounted to the PCB, wherein at least a portion of the circuitry is covered by the encapsulation housing, and heat generated by the circuitry is transferred through the heat transfer layer to the base plate.

8. The apparatus of claim 1, further comprising:
a cover integrally formed as part of the base plate; and
a cavity integrally formed as part of the cover;
wherein a portion of the heat transfer layer is adjacent the cover, and the cover is adjacent an area of the PCB unoccupied by the encapsulation housing.

9. The apparatus of claim 1, further comprising:
a circumferential lip integrally formed as part of the base plate such that the circumferential lip circumscribes the cover;
wherein a portion of the heat transfer layer is adjacent the circumferential lip.

10. The apparatus of claim 1, further comprising:
at least one groove integrally formed as part of the encapsulation housing such that a portion of the at least one groove is formed by the heat transfer layer, and another portion of the at least one groove is formed by a second layer;

wherein a portion of the base plate is disposed in the at least one groove, connecting the base plate and the encapsulation housing.

11. A method for making a control unit, comprising the steps of:
providing a base plate;
providing a printed circuit board (PCB); and
providing circuitry mounted to the PCB;
placing the PCB in contact with the base plate;
providing at least one flow aperture integrally formed as part of the base plate;
over molding an epoxy around portions of the base plate, portions of the circuitry, and portions of the PCB to form an encapsulation housing having a heat transfer layer, and the encapsulation housing connects the base plate to the PCB, and the heat transfer layer transfers heat from the PCB to the base plate;
over molding the epoxy around portions of the base plate and the PCB such that the heat transfer layer is disposed on the opposite side of the PCB relative to a first layer of the encapsulation housing, and the heat transfer layer is disposed on the opposite side of the base plate relative to a second layer of the encapsulation housing;
over molding the epoxy around portions of the base plate and the PCB such that at least a portion of the encapsulation housing is disposed in the at least one flow aperture, and is integrally formed with the heat transfer layer and the second layer.

12. The method of claim 11, further comprising the steps of the heat transfer layer electrically insulating the base plate from the PCB.

13. The method of claim 11, further comprising the steps of:
providing a first plurality of assembly apertures integrally formed as part of the PCB; and
providing a second plurality of assembly apertures integrally formed as part of the base plate;
aligning each of the first plurality of assembly apertures with a corresponding one of the second plurality of assembly apertures as the PCB is placed in contact with the base plate, such that a portion of the encapsulation housing extends through each of the first plurality of assembly apertures and the second plurality of assembly apertures once the epoxy is over molding around portions of the base plate and the PCB.

14. The method of claim 13, further comprising the steps of over molding the epoxy around portions of the base plate and the PCB to form at least one stanchion as part of the encapsulation housing such that the at least one stanchion is integrally formed with the heat transfer layer, and the at least one stanchion extends through a corresponding one of the first plurality of assembly apertures and at least one of the second plurality of assembly apertures.

15. The method of claim 11, further comprising the steps of:
providing a cover integrally formed as part of the base plate; and
providing a cavity integrally formed as part of the cover;
over molding the epoxy around portions of the base plate and the PCB such that a portion of the heat transfer layer is adjacent the cover, and the cover is adjacent an area of the PCB unoccupied by the encapsulation housing.

16. The method of claim 11, further comprising the steps of:
providing at least one standoff integrally formed as part of the base plate and is in contact with the PCB;

over molding the epoxy around portions of the base plate and the PCB such that the at least one standoff extends through the heat transfer layer.

17. The method of claim 11, further comprising the steps of:

provide at least one groove integrally formed as part of the encapsulation housing;

over molding the epoxy around portions of the base plate and the PCB to form the encapsulation housing such that a portion of the at least one groove is formed by the heat transfer layer, another portion of the at least one groove is formed by the second layer, and a portion of the base plate is disposed in the at least one groove, connecting the base plate and the encapsulation housing.

* * * * *